(12) United States Patent
Jin et al.

(10) Patent No.: US 6,897,729 B1
(45) Date of Patent: May 24, 2005

(54) SELF-CALIBRATING GAIN CONTROL CIRCUIT FOR LOW NOISE AMPLIFIER

(75) Inventors: Xiaodong Jin, Sunnyvale, CA (US); Lawrence Tse, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/889,643

(22) Filed: Jul. 12, 2004

Related U.S. Application Data

(63) Continuation of application No. 10/301,349, filed on Nov. 20, 2002, now Pat. No. 6,784,738.

(51) Int. Cl.[7] .................................................. H03F 3/04
(52) U.S. Cl. ........................ 330/296; 330/310; 330/311; 330/289; 330/272; 330/273; 330/267
(58) Field of Search ................................. 330/263, 265, 330/267, 268, 272, 273, 296, 310, 311, 289

(56) References Cited

U.S. PATENT DOCUMENTS

| | | | |
|---|---|---|---|
| 5,907,263 A | | 5/1999 | Divine et al. |
| 6,043,714 A | * | 3/2000 | Yamamoto et al. ......... 330/296 |
| 6,100,761 A | | 8/2000 | Ezell |
| 6,130,581 A | | 10/2000 | Nevin |
| 6,191,626 B1 | | 2/2001 | Prysby et al. |
| 6,194,968 B1 | | 2/2001 | Winslow |
| 6,259,323 B1 | | 7/2001 | Salminen |
| 6,285,865 B1 | | 9/2001 | Vorenkamp et al. |
| 6,313,705 B1 | | 11/2001 | Dening et al. |
| 6,577,114 B1 | | 6/2003 | Roo |

OTHER PUBLICATIONS

U.S. Appl. No. 10/379,116, filed Mar. 4, 2003, entitled, "Calibration Circuit", pp. 1–37 and 3 sheets of drawings.
U.S. Appl. No. 10/379,260, filed Mar. 4, 2003, entitled, "Calibration Circuit", pp. 1–37, and 3 sheets of drawings.
Ding, Y. and Harjani, R. (Oct. 2001) "A+18dBm IIP3 LNA in 0.35.m CMOS," IEEE International Solid–State Circuits Conference Session 10 (Wireless Building Blocks), pp. 162–163.
Gatta, F. et al. (Oct. 2001) "A 2–dB Noise Figure 900–MHz Differential CMOS LNA, "IEEE Journal of Solid–State Circuits, vol. 36, No. 10, pp. 1444–1452.
Gramegna, G. et al., (2000) "Ultra–Wide Dynamic Range 1.75dB Noise–Figure, 900MHz CMOS LNA, "IEEE Journal of Solid–State Circuits Conference Session 23, 11 pages total.
Gramegna, G. et al. (Jul. 2001) "A Sub–1–dB NF+2.3kV ESD–Protected 900–MHz CMOS LNA," IEEE Journal of Solid–State Circuits, vol. 36, No. 7, pp. 1010–1017.

(Continued)

*Primary Examiner*—Michael B Shingleton

(57) ABSTRACT

An amplifier comprises a Low Noise Amplifier (LNA) that amplifies a Radio Frequency (RF) signal that includes a transconductance, a gain and an input stage that receives the RF signal. A bias assembly includes a bias circuit with a bias resistance and generates a bias current for the input stage of the LNA, which is related to the bias resistance. A shunt feedback stage amplifies an output of the input stage, generates an RF output and includes a shunt resistance. Changes in the bias resistance due to changes in conditions are substantially offset by changes in the shunt resistance due to the changes in conditions, which reduces variation of the gain of the LNA based on the changes in conditions.

42 Claims, 4 Drawing Sheets

OTHER PUBLICATIONS

Karanicolas, A.N. (Dec. 1996) "A 2.7–V 99–MHz CMOS LNA and Mixer, "IEEE Journal of Solid–State Circuits, vol. 31, No. 12, pp. 1939–1944.

Leroux, P. et al. (Jun. 2002) "A 0.8–dB NF ESD–Protected 9mW CMOS LNA," IEEE International Solid–State Circuits Conference Session 26 (Wireless Building Blocks 11/O), pp. 410–411.

Leroux P. et al. (Jun. 2002) "A 9–mW CMOS LNA Operating at 1.23 GMz," IEEE Journal of Solid–State Circuits, vol. 37, No. 6, pp. 760–765.

Zhou, J. and Allstot, D.J. (1998). "A Fully Integrated CMOS 900MHz LNA Utilizing Monolithic Transformers," IEEE, vol. 8.6, pp. 1–9.

\* cited by examiner

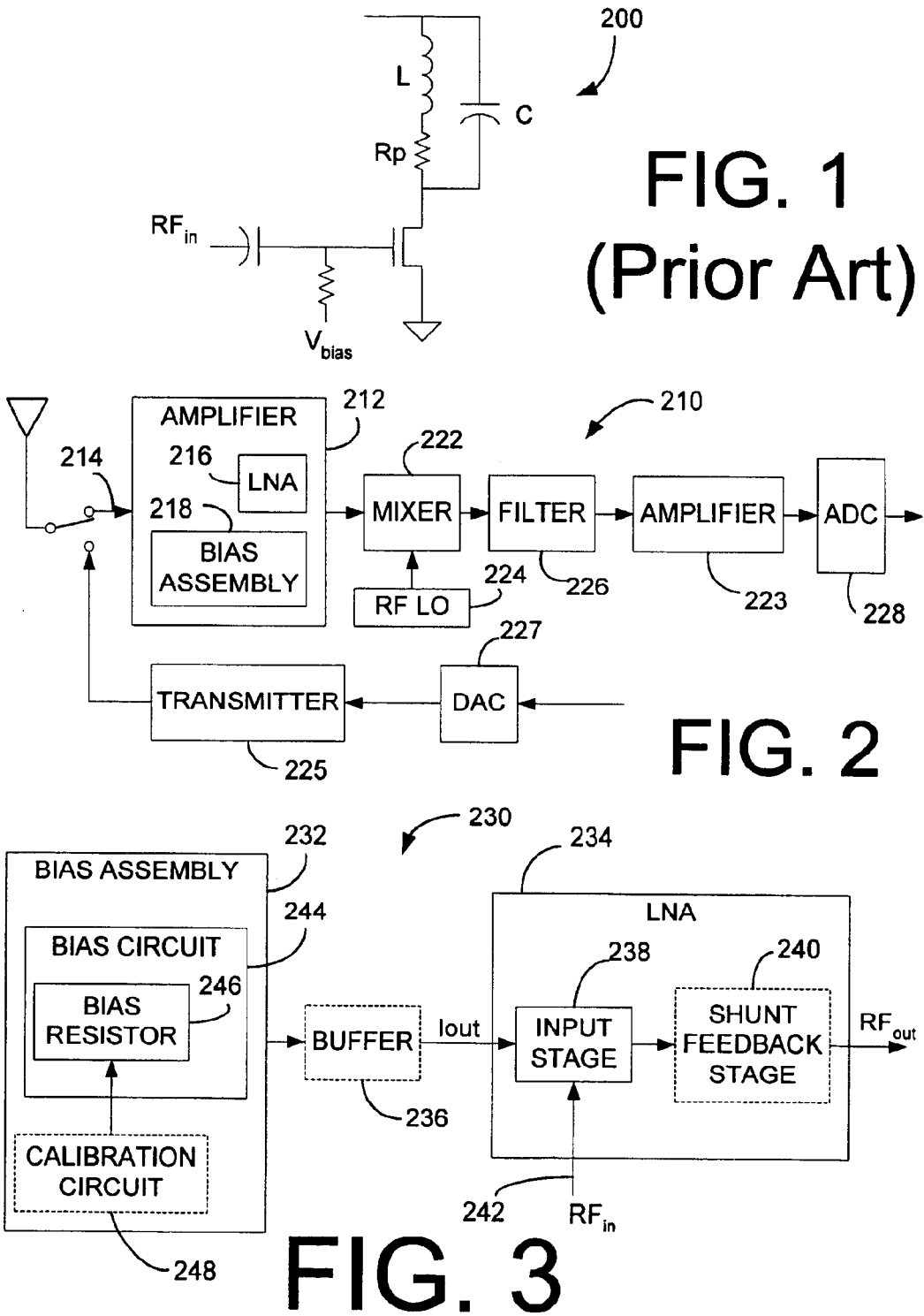

SELF-CALIBRATING GAIN CONTROL CIRCUIT FOR LOW NOISE AMPLIFIER

CROSS-REFERENCE TO RELATED APPLICATIONS

This application is a continuation of U.S. patent application Ser. No. 10/301,349 filed on Nov. 20, 2002 now U.S. Pat. No. 6,784,738. The disclosure of the above application is incorporated herein by reference.

TECHNICAL FIELD

This invention relates to low noise amplifiers (LNA).

BACKGROUND

One of the key building blocks of a conventional RF transceiver is a Low Noise Amplifier (LNA). FIG. 1 shows an implementation of a CMOS LNA high gain path 200 commonly adopted in conventional RF transceivers. The gain of this amplifier can be expressed as:

$A_v = g_m \cdot Q^2 \cdot R_p$ where gm is the transconductance of the input device, Q is the quality factor of the load inductor and $R_p$ is the parasitic resistance associated with the inductor.

Referring to the equation above, the gain is a strong function of gm of the input transistor, as well as the Q of the inductor of the LNA. gm may vary +/−30–40%, and the $Q^2 R_p$ term typically varies +/−10–20% due to process, temperature etc. variation. As a result, the gain of the LNA can easily vary by greater than 6 dB. This gain variation may affect receiver performance significantly in real life applications and hence, the implementation may not be desirable.

SUMMARY

An amplifier comprises a Low Noise Amplifier (LNA) that amplifies a Radio Frequency (RF) signal and that includes a transconductance, a gain and an input stage that receives the RF signal. A bias assembly includes a bias circuit with a bias resistance and generates a bias current for the input stage of the LNA, which is related to the bias resistance. A shunt feedback stage amplifies an output of the input stage, generates an RF output and includes a shunt resistance. Changes in the bias resistance due to changes in conditions are substantially offset by changes in the shunt resistance due to the changes in conditions, which reduces variation of the gain of the LNA based on the changes in conditions.

In other features, the bias resistance and the shunt resistance include the same type of resistors. The conditions include at least one of process, temperature, environmental, and/or power variations. The bias resistance and the shunt resistance include poly resistors.

In other features, an integrated circuit comprises the amplifier. The shunt resistance is arranged on the integrated circuit in close proximity to the bias resistance such that the conditions of the bias resistance substantially mirror the conditions of the shunt resistance.

In other features, the bias circuit further includes a first transistor having a gate, a source and a drain. A second transistor has a gate, a source, and a drain. The gate and drain of the second transistor and the gate of the first transistor communicate. A source of the first transistor communicates with a first end of the bias resistance. The bias circuit further includes a current mirror that communicates with the drains of the first and second transistors and that outputs the bias current. The bias circuit further includes a bias current buffer that communicates with the current mirror and that supplies a buffered current based on the bias current. The current mirror includes a third transistor that has a first size and that communicates with the drain of the first transistor. A fourth transistor has a second size and communicates with the drain of the second transistor. The first size is substantially equal to the second size.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a block diagram of a conventional LNA.

FIG. 2 is a block diagram of an aspect of a transceiver.

FIG. 3 is a block diagram of an aspect of an amplifier for amplifying an RF signal.

Like reference symbols in the various drawings indicate like elements.

DETAILED DESCRIPTION

Figure 4:
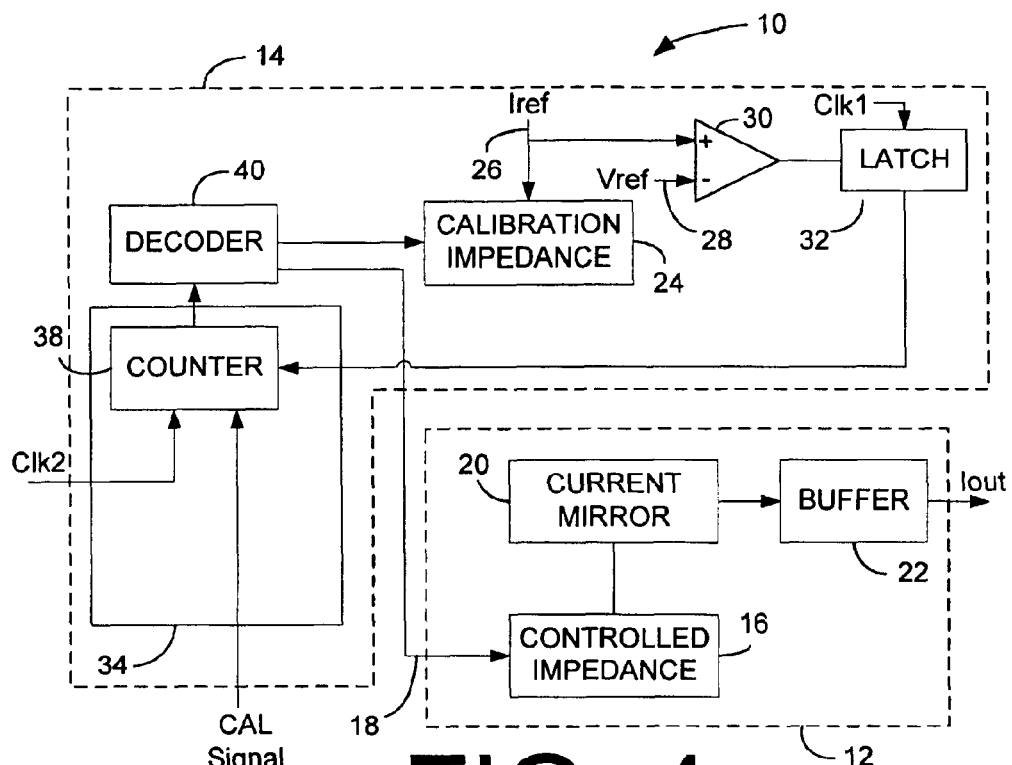
FIG. 4 is a block diagram of an aspect of an LNA biasing scheme.

FIG. 2 shows an aspect of a wireless transceiver 210 for communicating information. The receive path of the wireless transceiver 210 may include an amplifier 212 for amplifying an input signal 214. The amplifier 212 may include a bias assembly 218 and LNA 216 constructed in accordance with the principles of the invention. A mixer 222 may combine the amplified input signal with a Radio Frequency (RF) LO signal 224. A filter 226 and adjustable amplifier 223 may filter and amplify the combined signal, and mix the generated signal with an Intermediate Frequency (IF) LO signal down to baseband for possibly further amplification and filtering. An analog-to-digital converter (ADC) 228 may convert the mixed signal to a digital signal for further processing.

In the transmit path, a digital-to-analog converter 227 may convert a digital signal to an analog signal for transmission by a transmitter 225.

FIG. 3 shows an aspect of an amplifier 230 for generating an RF output. The amplifier 230 is configured to compensate for gain variations that may be caused by process and environmental variations. The amplifier 230 is suitable for assembly as an integrated circuit fabricated with CMOS techniques. The amplifier 230 includes a bias assembly 232 for supplying a bias current, Iout, to an LNA 234. A bias current buffer 236 may be connected between the bias assembly 232 and LNA 234 to level shift and amplify the bias current.

In one aspect, the LNA 234 may include an input stage 238 and a shunt feedback stage 240 to amplify an $RF_{in}$ signal 242. To compensate for gain changes related to resistive component variations in the shunt feedback stage 240, the bias assembly 232 may be configured to have a resistive variation that is about inversely proportional to the shunt feedback stage resistive variation. The bias assembly 232 may, for example, include a bias circuit 244 to generate the bias current as a function of a bias resistor 246, where environmental variations of the bias resistor resistance may partially or completely cancel resistance variations of the shunt feedback stage 240.

In another aspect, the LNA 234 may include an input stage 238 to amplify the $RF_{in}$ signal 242, but not include a shunt feedback stage 240. A bias assembly 232 may include a bias circuit 244 to generate the bias current as a function of a bias resistor 246. The bias resistor 246 may be either an on-chip resistor or an external resistor. If an on-chip resistor is used, the bias assembly 232 may also include a calibration circuit 248 to partially or completely cancel resistance variations of the bias resistor 246.

FIG. 4 shows an aspect of a bias assembly 10 for supplying a bias current, Iout, to an LNA (not shown). The bias assembly 10 is suitable for assembly as an integrated circuit fabricated with CMOS techniques. The bias assembly 10 includes a bias circuit 12 and a calibration circuit 14. The bias circuit 12 generates the bias current as a function of a bias impedance 16. The bias impedance 16 may be controlled in response to a control signal 18 from the calibration circuit 14 to maintain a relatively constant value over variations in operating conditions such as process variations and environmental conditions variations.

Figure 5:
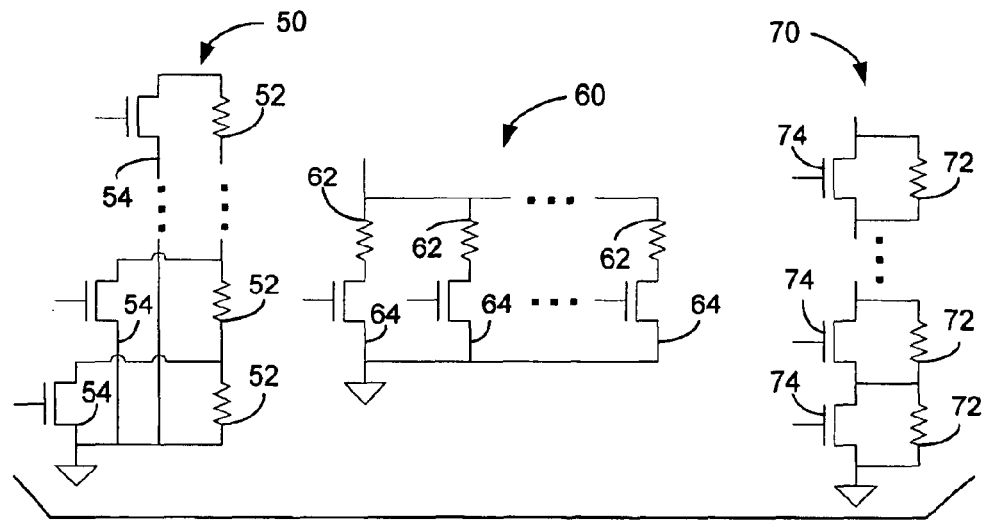
FIG. 5 is a detailed schematic diagram of an aspect of several bias impedance configurations.

Referring to FIG. 5, several configurations of the bias impedance are shown. A hybrid configuration 50 includes a series string of resistors 52 and control transistors 54 that are connected in shunt with one or more of the resistors 52. A series configuration 60 includes a series string of resistors 62 with control transistors 64 that are connected in shunt with each resistor 62. A shunt configuration 70 includes groupings of a resistor 72 connected in series with a control transistor 74 and the series combinations of resistor-transistor connected in shunt. The resistors in each of the configurations may be made from any suitable material including N+ poly and P+ poly.

Referring to FIG. 4, a bias voltage that may include temperature and process compensation is applied across the bias impedance 16 to generate the bias current. The bias current is supplied to a current mirror 20 that may reflect the bias current to a buffer 22. The buffer 22 supplies the bias current to an LNA (not shown) and may be configured as either a P Metal Oxide Semiconductor (PMOS) or an NMOS current mirroring gain buffer. The device characteristics of the buffer 22 may be varied in relation to the current mirror 20 to change the amplitude of the bias current supplied by the buffer 22. For example, the size of the buffer 22 may be varied relative to the current mirror to cause a corresponding change in the current supplied.

The calibration circuit 14 may determine the effect of process and environmental variations on a calibration impedance 24 such as a poly resistor. The calibration impedance 24 preferably is constructed from similar material, has a similar configuration, and is located in close proximity to the bias impedance 16 so that changes in the calibration impedance 24 may track changes in the bias impedance 16. A reference current, Iref, 26 may be applied to the calibration impedance 24 to generate a calibration voltage that is compared to a reference voltage, Vref, 28. The reference current 26 may be generated from a fixed voltage such as the reference voltage 28 and a fixed resistor that maintains a predictable value over process and environmental variations. A comparator 30 monitors changes in the calibration impedance 24 relative to the voltage reference 28. A latch 32 may latch the output of the comparator 30 synchronous to a clock. A calibration control circuit 34 may delay the latch output to reduce the impact of noise generated at the clock edges. The calibration control circuit 34 may include control logic and a up/down counter 38. A calibration signal, CAL, enables the calibration control circuit 34. A clock signal, Clk2, provides a timing reference for the counter 38. A decoder 40 interprets the signal from the calibration control circuit 34 and in response may control the resistance of the calibration impedance 24 by enabling or disabling control transistors.

Figure 6:
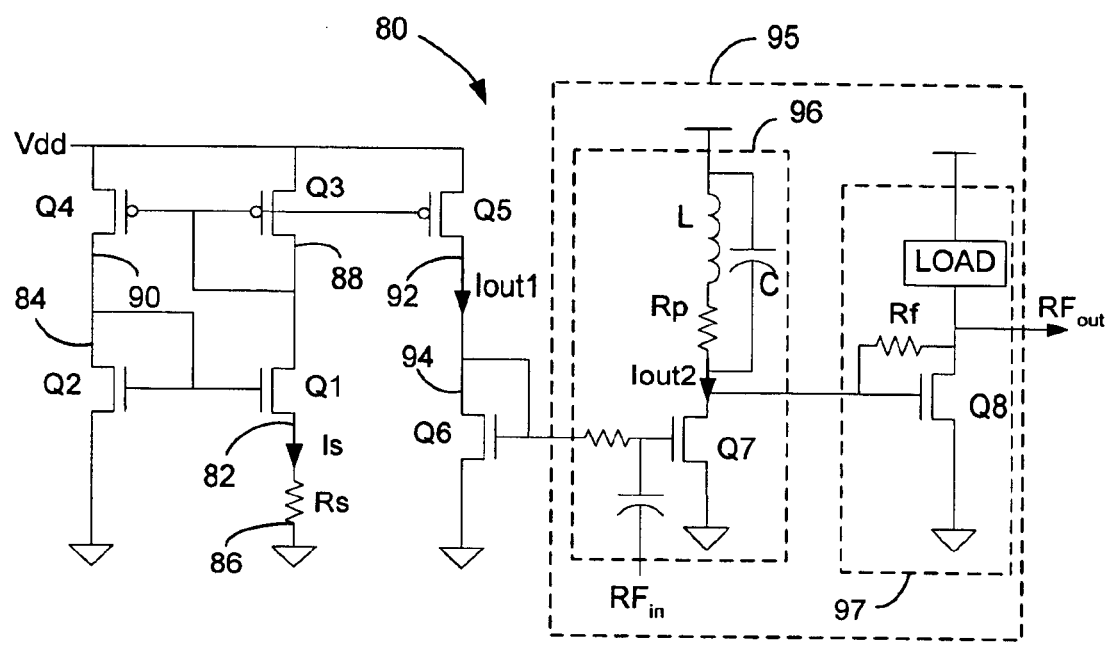
FIG. 6 is a detailed schematic diagram of an aspect of a bias circuit for an LNA.

FIG. 6 shows an aspect of a bias circuit 80 for generating an LNA bias current. The bias circuit 80 may include a PMOS current mirror pair, $Q_3$ and $Q_4$, and a pair of NMOS transistors, $Q_1$ and $Q_2$, 82 and 84 for generating a controlled current, Is, through a resistor, $R_s$, 86. A size ratio, K, of $Q_1$ and $Q_2$ is selected to provide a desired current amplitude of Is. The following equations show the relation between the transconductance of $Q_1$ and $R_s$, if the currents flowing through $Q_1$ and $Q_2$ are equal, $$\sqrt{\frac{2I_s}{\mu C \frac{W}{L}}} + V_{TH1} = \sqrt{\frac{2I_s}{\mu C \left(\frac{W}{L}\right) \cdot K}} + V_{TH2} + I_s \cdot R_s$$

Canceling $V_{TH1}$ and $V_{TH2}$, and rearranging terms;

$$I_s = \frac{2}{\mu C \left(\frac{W}{L}\right)} \cdot \frac{1}{R_s^2} \left(1 - \frac{1}{\sqrt{K}}\right)^2 \qquad \text{Equation 1}$$

The pair of PMOS transistors, $Q_3$ and $Q_4$, 88 and 90 may be selected to have the same size so that the currents flowing through drains of $Q_1$ and $Q_2$ are substantially equal. With equal currents in $Q_1$ and $Q_2$, the relationship described by Equation 1 is maintained. A buffer 92 is preferably the same type of transistor as $Q_3$ and $Q_4$, 88 and 90, and may be sized in relation to $Q_3$ to vary the amplitude of current, Iout flowing from the buffer 92. For example, if the buffer 92 is selected to be three times larger than $Q_3$, then $I_{out1}$ will be three times larger than Is. A current mirror 94 including transistors $Q_6$ and $Q_7$ may be connected to the buffer 92 to set a bias current, $I_{out2}$, of an LNA 95. The ratio of the sizes of $Q_6$ and $Q_7$ may be varied to change the amplitude of $I_{out2}$ with respect to $I_{out1}$.

If the size ratio of $Q_5$ and Q3 is M and the ratio of Q7 and $Q_6$ is N, then the bias current $I_{out2}$ flowing into $Q_7$ will be:

$$g_{m,Q7} = \sqrt{2\mu C \left(\frac{W}{L}\right) \cdot I_{out2}} = \frac{2\sqrt{MN}}{R_s}\left(1 - \frac{1}{\sqrt{K}}\right)$$

Solving for $g_m$, $Q_7$ $$I_{out2} = MNI_s = \frac{2MN}{\mu C \left(\frac{W}{L}\right)} \cdot \frac{1}{R_s^2}\left(1 - \frac{1}{\sqrt{K}}\right)^2$$

It can be seen that the transconductance of the LNA input stage is predominately dependent on the resistor value $R_s$. $R_s$ may be implemented as an external resistor or an on chip resistor. If $R_s$ is implemented as an on chip resistor, then the resistance value of $R_s$ will vary with process and environmental variations. The variation of the LNA gain to process and environmental changes may be reduced by using any of several techniques including 1) a calibration scheme to reduce the variation of $R_s$ with process and environmental changes, and 2) adding a shunt feedback stage to cancel out the resistor variation.

In one aspect, the LNA 95 may include an input stage 96 to amplify an RF input signal, $RF_{in}$. Recall that the gain of the LNA is:

$$A_v = g_m \cdot Q^2 \cdot R_p \propto \frac{Q^2 R_p}{R_s}$$

Since $R_s$ will be calibrated, the $Q^2 R_p$ term becomes the dominant contributor of gain variation, varying by about 10%–20%.

In another aspect, the LNA 95 may also include a shunt feedback stage 97 connected to the input stage 96 to further amplify $RF_{in}$. The gain of this LNA can be expressed as:

$$A_v = g_m \cdot R_f \propto \frac{R_f}{R_s},$$

where $R_f$ is the shunt feed back resistor. If $R_f$ is chosen to be the same type of resistor as $R_s$, a good match can be achieved, leading to improved gain accuracy.

Figure 7:
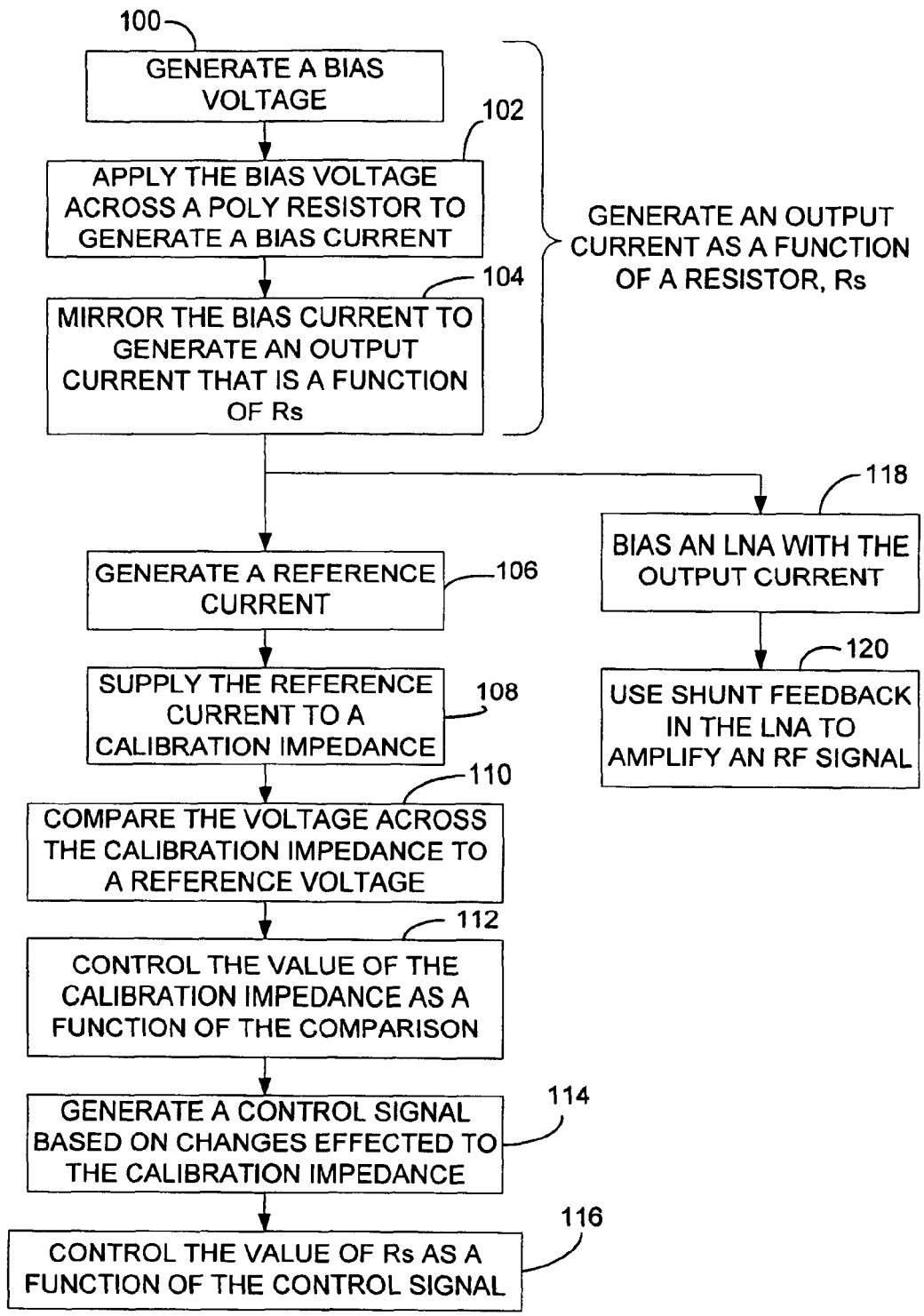
FIG. 7 is a flow diagram of an aspect of generating a bias current for an LNA.

FIG. 7 shows an operation for amplifying an RF signal. Starting at block 100, a bias voltage may be generated by a two transistor circuit. The bias voltage may be equal to the difference between the $V_{gs}$ voltages of the two transistors. At block 102, the bias voltage is applied across a bias impedance to generate a bias current. The bias impedance may be controllable and may include one or more poly resistors in combination with switches. The magnitude of the bias current may be a function of the poly resistors and the physical characteristics of the two transistors including size ratio, width, length, and capacitance. At block 104, the bias current is mirrored to generate an output current that is a function of the poly resistance.

In one aspect, at block 106, a reference current is generated. At block 108, the reference current is supplied to a controlled calibration impedance that may include several poly resistors in combination with switches. At block 110, the voltage developed across the controlled calibration impedance may be compared to a reference voltage. At block 112, the impedance of the controlled calibration impedance may be controlled as a function of the comparison to reduce the difference between the reference voltage and the voltage developed across the controlled calibration impedance. Different ones of the control switches are turned on or off to effect the desired control. At block 114, a control signal may be generated to indicate the change in the controlled calibration impedance that cancels the difference between the reference voltage and the voltage developed across the controlled calibration impedance. The control signal may indicate the state of each of the control switches. At block 116, the impedance of the controlled bias impedance may be controlled in response to the control signal so that changes in the poly resistance are compensated for by effecting the same changes to the controlled bias impedance that are effected for the controlled calibration impedance. Variations in the resistance of the poly resistors caused by process, environmental conditions, and operating conditions may be compensated for by controlling for the change in resistance of the controlled calibration impedance poly resistors and mirroring that control to the controlled bias impedance poly resistors. By compensating for changes in the resistance of the poly resistors, the transconductance of the LNA may be held constant over process variations and environmental conditions resulting in a relatively constant LNA gain, with the dominant variation resulting from the effective impedance from the inductor tank.

In another aspect, continuing from block 104 to block 118 an LNA is biased with the output current. The LNA may include an input stage to receive an RF input signal. At block 120, a portion of the amplified RF input signal may be communicated to the input stage using a shunt resistor to provide feedback. Variations in the shunt resistor may be compensated for by variations in the bias impedance to cause the gain of the amplifier to be substantially independent of changes in conditions that affect the values of the resistors.

Those skilled in the art can now appreciate from the foregoing description that the broad teachings of the current invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An amplifier, comprising:
   a Low Noise Amplifier (LNA) that amplifies a Radio Frequency (RF) signal and that includes a transconductance, a gain and an input stage that receives the RF signal;
   a bias assembly that includes a bias circuit with a bias resistance and that generates a bias current for the input stage of the LNA, which is related to the bias resistance; and
   a shunt feedback stage that amplifies an output of the input stage, that generates an RF output and that includes a shunt resistance, wherein changes in the bias resistance due to changes in conditions are substantially offset by changes in the shunt resistance due to the changes in conditions, which reduces variation of the gain of the LNA based on the changes in conditions.

2. The amplifier of claim 1 wherein the bias resistance and the shunt resistance are the same type of resistors.

3. The amplifier of claim 1 wherein the conditions include at least one of process, temperature, environmental, and/or power variations.

4. The amplifier of claim 2 wherein the bias resistance and the shunt resistance include poly resistors.

5. An integrated circuit comprising the amplifier of claim 1.

6. The integrated circuit of claim 5 wherein the shunt resistance is arranged on the integrated circuit in close proximity to the bias resistance such that the conditions of the bias resistance substantially mirror the conditions of the shunt resistance.

7. The amplifier of claim 1 wherein the bias circuit further includes:
   a first transistor having a gate, a source and a drain; and
   a second transistor having a gate, a source, and a drain, wherein the gate and drain of the second transistor and the gate of the first transistor communicate, and wherein a source of the first transistor communicates a first end of the bias resistance.

8. The amplifier of claim 7 wherein the bias circuit further includes a current mirror that communicates with the drains of the first and second transistors and that outputs the bias current.

9. The amplifier of claim 8 wherein the bias circuit further includes a bias current buffer that communicates with the current mirror and that supplies a buffered current based on the bias current.

10. The amplifier of claim 8 wherein the current mirror includes:
a third transistor that has a first size and that communicates with the drain of the first transistor; and
a fourth transistor that has a second size and that communicates with the drain of the second transistor, wherein the first size is substantially equal to the second size.

11. An amplifier, comprising:
a Low Noise Amplifier (LNA) that amplifies a Radio Frequency (RF) signal and that includes a transconductance, a gain and an input stage that receives the RF signal;
a bias circuit that generates a bias current that biases the input stage of the LNA and that substantially reduces changes in the gain of the LNA due to changes in conditions, wherein the bias circuit includes a first resistance having a first resistance value that changes due to the changes in conditions and wherein the bias current is related to the first resistance; and
an output circuit that communicates with the LNA and that includes a second resistance having a second resistance value that changes due to the changes in conditions, wherein changes in the bias current due to the changes in the first resistance value are substantially offset by changes in the second resistance value, which reduces variation of the gain of the LNA.

12. The amplifier of claim 11 wherein the conditions include at least one of process, temperature, environmental, and/or power variations.

13. The amplifier of claim 12 wherein the output circuit includes a shunt feedback circuit that amplifies an output of the input stage, that generates an RF output and that includes the second resistance.

14. The amplifier of claim 11 wherein the first resistance and the second resistance are the same type of resistors.

15. The amplifier of claim 14 wherein the first resistance and the second resistance include poly resistors.

16. An integrated circuit comprising the amplifier of claim 11.

17. The integrated circuit of claim 16 wherein the second resistance is arranged on the integrated circuit in close proximity to the first resistance such that the conditions of the first resistance substantially mirror the conditions of the second resistance.

18. The amplifier of claim 11 wherein the bias circuit further includes:
a first transistor having a gate, a source and a drain; and
a second transistor having a gate, a source, and a drain, wherein the gate and drain of the second transistor and the gate of the first transistor communicate, and wherein a source of the first transistor communicates with a first end of the first resistance.

19. The amplifier of claim 18 wherein the bias circuit further includes a current mirror that communicates with the drains of the first and second transistors and that outputs the bias current.

20. The amplifier of claim 19 wherein the bias circuit further includes a bias current buffer that communicates with the current mirror and that supplies a buffered current based on the bias current.

21. The amplifier of claim 20 wherein the current mirror includes:
a third transistor that has a first size and that communicates with the drain of the first transistor; and
a fourth transistor that has a second size and that communicates with the drain of the second transistor, wherein the first size is substantially equal to the second size.

22. An amplifier, comprising:
amplifying means for amplifying a Radio Frequency (RF) signal and that includes a transconductance, a gain and an input stage that receives the RF signal;
bias means for generating a bias current for the input stage of the amplifying means and including bias resistance means for providing a bias resistance, wherein the bias current is related to the bias resistance; and
shunt feedback means for amplifying an output of the input stage, for generating an RF output and that includes shunt resistance means for providing a shunt resistance, wherein changes in the bias resistance due to changes in conditions are substantially offset by changes in the shunt resistance due to the changes in conditions, which reduces variation of the gain of the amplifying means based on the changes in conditions.

23. The amplifier of claim 22 wherein the bias resistance means and the shunt resistance means include the same type of resistors.

24. The amplifier of claim 22 wherein the conditions include at least one of process, temperature, environmental, and/or power variations.

25. The amplifier of claim 22 wherein the bias resistance means and the shunt resistance means include poly resistors.

26. An integrated circuit comprising the amplifier of claim 22.

27. The integrated circuit of claim 26 wherein the shunt resistance means is arranged on the integrated circuit in close proximity to the bias resistance means such that the conditions of the bias resistance means substantially mirror the conditions of the shunt resistance means.

28. The amplifier of claim 22 wherein the bias means further includes:
a first transistor having a gate, a source and a drain; and
a second transistor having a gate, a source, and a drain, wherein the gate and drain of the second transistor and the gate of the first transistor communicate, and wherein a source of the first transistor communicates a first end of the bias resistance means.

29. The amplifier of claim 28 wherein the bias means further includes current mirror means that communicates with the drains of the first and second transistors for outputting the bias current.

30. The amplifier of claim 29 wherein the bias means further includes bias current buffer means that communicates with the current mirror means for supplying a buffered current based on the bias current.

31. The amplifier of claim 29 wherein the current mirror means includes:
a third transistor that has a first size and that communicates with the drain of the first transistor; and
a fourth transistor that has a second size and that communicates with the drain of the second transistor, wherein the first size is substantially equal to the second size.

32. An amplifier, comprising:
amplifying means for amplifying a Radio Frequency (RF) signal and that includes a transconductance, a gain and an input stage that receives the RF signal;
bias means for generating a bias current that biases the input stage of the amplifying means and that substantially reduces changes in the gain of the amplifying means due to changes in conditions, wherein the bias means includes first resistance means for providing a first resistance that changes due to the changes in conditions and wherein the bias current is related to the first resistance; and output means for receiving an output of the amplifying means and that includes second resistance means for providing a second resistance that changes due to the changes in conditions, wherein changes in the bias current due to the changes in the first resistance are substantially offset by changes in the second resistance, which reduces variation of the gain of the amplifying means.

33. The amplifier of claim 32 wherein the conditions include at least one of process, temperature, environmental, and/or power variations.

34. The amplifier of claim 32 wherein the output means includes shunt feedback means for amplifying an output of the input stage and for generating an RF output and that includes the second resistance means.

35. The amplifier of claim 32 wherein the first resistance means and the second resistance means include the same type of resistors.

36. The amplifier of claim 32 wherein the first resistance means and the second resistance means include poly resistors.

37. An integrated circuit comprising the amplifier of claim 32.

38. The integrated circuit of claim 37 wherein the second resistance means is arranged on the integrated circuit in close proximity to the first resistance means such that the conditions of the first resistance means substantially mirror the conditions of the second resistance means.

39. The amplifier of claim 32 wherein the bias means further includes:

a first transistor having a gate, a source and a drain; and a second transistor having a gate, a source, and a drain, wherein the gate and drain of the second transistor and the gate of the first transistor communicate, and wherein a source of the first transistor communicates with a first end of the first resistance means.

40. The amplifier of claim 39 wherein the bias means further includes current mirror means that communicates with the drains of the first and second transistors for outputting the bias current.

41. The amplifier of claim 40 wherein the bias means further includes buffer means that communicates with the current mirror means for supplying a buffered current based on the bias current.

42. The amplifier of claim 40 wherein the current mirror means includes:

a third transistor that has a first size and that communicates with the drain of the first transistor; and a fourth transistor that has a second size and that communicates with the drain of the second transistor, wherein the first size is substantially equal to the second size.

* * * * *

UNITED STATES PATENT AND TRADEMARK OFFICE
CERTIFICATE OF CORRECTION

PATENT NO. : 6,897,729 B1  Page 1 of 1
APPLICATION NO. : 10/889643
DATED : May 24, 2005
INVENTOR(S) : Jin et al.

It is certified that error appears in the above-identified patent and that said Letters Patent is hereby corrected as shown below:

On the title page item (57), Line 2:   Insert -- and -- after "signal"

Column 1, Line 21:   Delete "gm" and insert -- $g_m$ --
Column 1, Line 26:   Delete "gm" and insert -- $g_m$ --
Column 1, Line 27:   Delete "gm" and insert -- $g_m$ --
Column 2, Line 57:   Delete "Iout" and insert -- $I_{out}$ --
Column 3, Line 16:   Delete "Iout" and insert -- $I_{out}$ --
Column 4, Line 39:   Delete "Iout" and insert -- $I_{out}$ --
Column 4, Line 47:   Delete "Q3" and insert -- $Q_3$ --
Column 4, Line 47:   Delete "Q7" and insert -- $Q_7$ --

Signed and Sealed this

Twenty-sixth Day of September, 2006

JON W. DUDAS
*Director of the United States Patent and Trademark Office*